(12) United States Patent
Chambers

(10) Patent No.: US 7,005,365 B2
(45) Date of Patent: Feb. 28, 2006

(54) STRUCTURE AND METHOD TO FABRICATE SELF-ALIGNED TRANSISTORS WITH DUAL WORK FUNCTION METAL GATE ELECTRODES

(75) Inventor: James J. Chambers, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/649,425

(22) Filed: Aug. 27, 2003

(65) Prior Publication Data
US 2005/0045923 A1  Mar. 3, 2005

(51) Int. Cl.
H01L 21/3205 (2006.01)
H01L 21/4763 (2006.01)

(52) U.S. Cl. ..................... 438/585; 438/587

(58) Field of Classification Search ........ 438/197–199, 438/217, 218, 585, 587, 588, 647, 652
See application file for complete search history.

(56) References Cited

U.S. PATENT DOCUMENTS

| | | | |
|---|---|---|---|
| 6,130,123 A * | 10/2000 | Liang et al. | 438/217 |
| 6,383,879 B1 | 5/2002 | Kizilyalli et al. | |
| 6,397,861 B1 | 6/2002 | Wing et al. | |
| 6,534,423 B1 | 3/2003 | Turner | |
| 6,583,012 B1 * | 6/2003 | Buynoski et al. | 438/275 |
| 2004/0080001 A1 * | 4/2004 | Takeuchi | 257/407 |

FOREIGN PATENT DOCUMENTS

GB  2 347 789 A  9/2000

OTHER PUBLICATIONS

"Pursuing the Perfect Low-K Dielectric"; www.e-insite.net/semiconductor/index.asp?layout=articlePrint&articleID=CA164243.
B. Maiti and P.J. Tobin; "Metal Gates for Advanced CMOS Technology"; SPIE vol. 3881; Sep. 1999; pp. 46-57.

* cited by examiner

Primary Examiner—Asok Kumar Sarkar
(74) Attorney, Agent, or Firm—Jacqueline J. Garner; W. James Brady, III; Frederick J. Telecky, Jr.

(57) ABSTRACT

The present invention provides, in one embodiment, a method (100) of forming dual work function metal gate electrodes in a semiconductor device. The method includes forming a gate dielectric (105) over a substrate (110) and depositing a mold layer (115) having a first opening (120) therein over the gate dielectric (105). The method further includes creating a first metal gate electrode (125) by depositing a first metal in the first opening (120). Other embodiments include an active device (200) produced by the above-described method and method of manufacturing an integrated circuit (300) using the above-described method.

6 Claims, 5 Drawing Sheets

STRUCTURE AND METHOD TO FABRICATE SELF-ALIGNED TRANSISTORS WITH DUAL WORK FUNCTION METAL GATE ELECTRODES

TECHNICAL FIELD OF THE INVENTION

The present invention is directed in general to semiconductor devices and the manufacture of semiconductor devices and, more specifically, to manufacturing dual work function metal gate structures for semiconductor devices.

BACKGROUND OF THE INVENTION

The ability to dope polysilicon gates to different degrees allows one to adjust the work function of gate electrode materials to particular types of complementary metal oxide silicon (CMOS) transistors. It is desirable to adjust the work function of a gate electrode to be close to either the conduction band or the valence band of silicon, because this reduces the threshold voltage of the transistor, thereby facilitating a high drive current. For instance, dual work function gates are advantageously used in semiconductor devices having both PMOS and NMOS transistors. The use of doped polysilicon gates becomes problematic, however, as the dimensions of gates and gate insulators are reduced.

Polysilicon gates can only accommodate a finite amount of dopant. This limitation can result in a depletion of gate charge carriers at the interface between the gate and gate dielectric, when the gate electrode of a device is biased to invert the channel. Consequently, the electrical thickness of the gate dielectric is substantially increased, thereby deteriorating the performance characteristics of the transistor, such as reducing the drive current and switching speed. For instance, the electrical thickness of a gate dielectric in some PMOS transistors can increase from about 1.0 nanometer during accumulation mode, to about 1.8 nanometer during inversion mode.

Metal gates are an attractive alternative to polysilicon because they have a larger supply of charge carriers than doped polysilicon gates. When a metal gate is inverted, there is no substantial depletion of carriers at the interface between the metal gate and gate dielectric. Accordingly, the transistor's performance is not deteriorated because the electrical thickness of the gate stack is not increased. The integration of semiconductor transistors having dual work function metal gates has been troublesome, however.

Ideally, dual work function metal gates should be compatible with conventional gate dielectric materials and have suitably adjustable work functions. Moreover, the fabrication of metal gates should be easily adaptable to conventional semiconductor device fabrication processes. It has proven challenging, however, to simply deposit and etch metals to form gate structures. For instance, it can be difficult to find etchants and etch conditions where gate metals can be etched with high selectively, that is, without damaging the underlying gate insulator and silicon substrate. Additionally, if two different metals are used to provide dual work function gates, a deposit-and-etch fabrication scheme entails the further complications of selectively etching one gate metal over another gate metal, or etching both metal gates simultaneously.

Previous attempts to reduce these difficulties have not been entirely successful. For instance, to protect the gate dielectric when the metal layer is patterned and etched, some manufacturers have proposed depositing an etch barrier layer between the gate dielectric and the metal layers. This process not only adds to the thickness to the gate dielectric, but also involves additional processing steps. To avoid the need to selectively etch one metal over another metal, some have proposed using a single metal, having midrange work function, as the gate material. Unfortunately, transistors having such single-metal gate electrodes have undesirably high threshold voltages.

Others have proposed a gate-last fabrication scheme. First, a conventional transistor is fully manufactured, including the fabrication of a polysilicon gate and with underlying doped regions implanted. The polysilicon gate and underlying gate dielectric are then removed to provide a gate opening. A new gate dielectric is then conformally deposited on the sides and bottom of the gate opening, followed by filling the gate opening with a metal, to replace the polysilicon gate. In addition to having extra processing steps, such gate-last fabrication schemes have a number of limitations.

In a gate-last fabrication schemes, dopants are implanted into various components of the transistor, such as the source and drain, before the new gate dielectric and replacing metal gate is formed. It follows, therefore, that gate-last fabrication schemes require that all subsequent steps to depositing the gate metal and gate dielectric are done at low temperatures (e.g., below about 700° C.) to prevent the diffusion of dopants. Low temperature processing is undesirable because high temperature anneals are done to improve the quality of the gate dielectric.

In addition, transistors manufactured using gate-last fabrication schemes are more prone to fringe-induced barrier lowering (FIBL). As well known by those skilled in the art, FIBL involves increased coupling between the source and the gate electrode due to the presence of insulating material with a high dielectric constant on the sides of the gate opening. This, in turn, can cause barrier lowering, resulting in transistors with undesirably high leakage current.

There is also a problem with the alignment of source and drain structures when using a gate-last fabrication scheme. When the conventional transistor is manufactured, the polysilicon gate is used as a mask to allow precise definition of the source/drain regions and alignment with the polysilicon gate. Such self-aligned structures minimize overlap between the gate and source and drain and thereby advantageously improve transistor performance reducing the capacitance between the gate and source drain structure.

Self-alignment is lost, however, when the polysilicon gate is replaced by the metal gate in a replacement gate flow. The metal gate does not have the same dimensions as the polysilicon gate because procedures to remove polysilicon can also remove portions of gate sidewall material. The presence of gate insulating material on the sides of the gate opening also contributes to the replacing metal gate having a different size than the polysilicon gate.

Accordingly, what is needed in the art is a method of manufacturing semiconductor devices having dual work function metal electrodes, while not introducing additional problems into semiconductor device manufacturing processes.

SUMMARY OF THE INVENTION

To address the above-discussed deficiencies of the prior art, one embodiment is directed to a method of forming dual work function metal gate electrodes in a semiconductor device. The method includes forming a gate dielectric over a substrate and depositing a mold layer having a first opening therein over the gate dielectric. The method further includes creating a first metal gate electrode by depositing a first metal in the first opening.

Another embodiment provides a method of manufacturing an integrated circuit. The method comprises using the above-described method to form active devices having dual work function metal gate electrodes over or in a semiconductor substrate. The method further includes forming interconnect metal lines on one of more insulating layers located over the active devices. The method also includes connecting the interconnects with the active devices to form an operative integrated circuit. Yet another embodiment is an active device produced by the above-describe method of forming dual work function metal gate electrodes.

The foregoing has outlined preferred and alternative features of the present invention so that those of ordinary skill in the art may better understand the detailed description of the invention that follows. Additional features of the invention described hereinafter can also form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention recognizes the advantageous use of a gate-first fabrication scheme for manufacturing dual work function metal gate electrodes in semiconducting devices. Forming the dual work function metal gate electrodes as an early step in device manufacturing provides several benefits. The underlying gate insulating layer can be subjected to high temperature anneals to improve its functional properties, before implanting dopants into various components of the device. Moreover, the metal gate can be used as a mask so that dopants implanted to form source and drain structures are self-aligned with the gate.

Figure 1A:
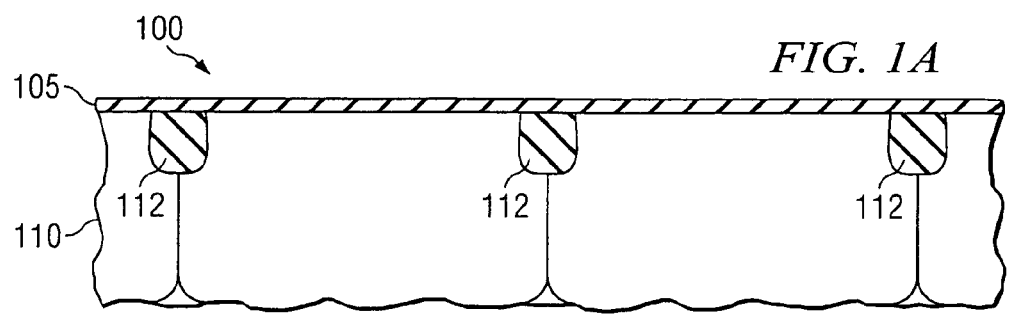
FIGS. 1A to 1L illustrate sectional views of selected steps in a method of manufacturing a semiconductor device according to the principles of the present invention.

One embodiment of the present invention is a method of manufacturing a semiconductor device. FIGS. 1A to 1L illustrate sectional views of selected steps in a method of manufacturing a semiconductor device 100, according to the principles of the present invention. Turning to FIG. 1A, the method includes forming a gate dielectric 105 over a substrate 110. In some embodiments, it is advantageous to form isolation structures 112, via shallow trench isolation. As well understood by those skilled in the art, however, isolation structures 112 could be formed at any number of stages in the method.

Figure 1B:
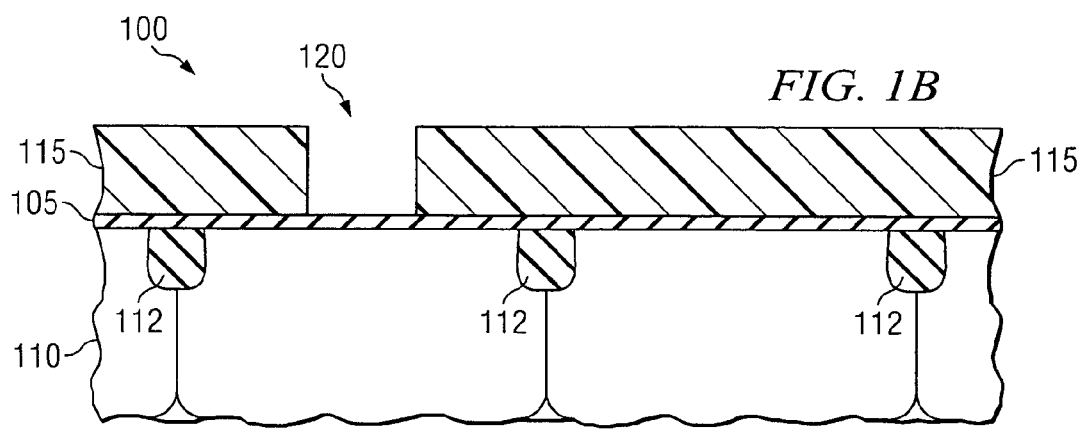
Figure 1C:
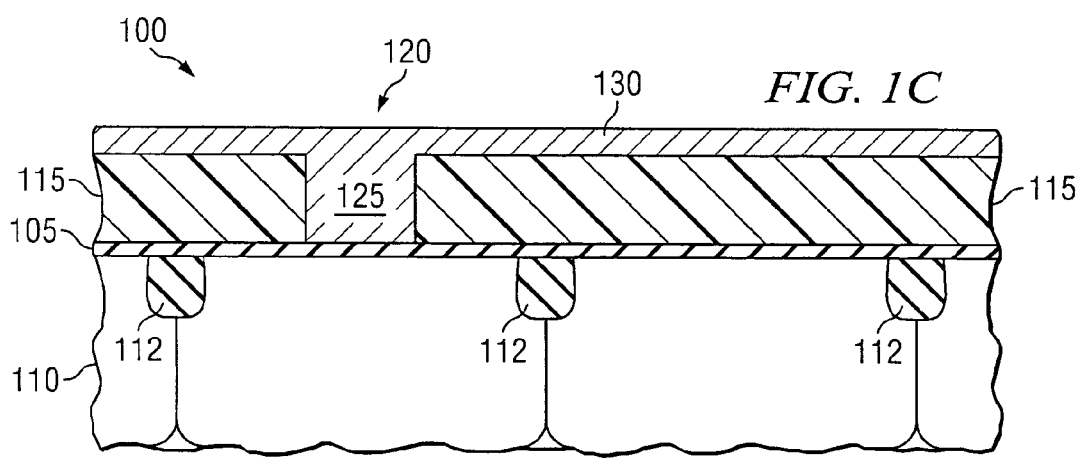

As further illustrated in FIG. 1B, the method also includes depositing a mold layer 115 having a first opening 120 therein over the gate dielectric 105. As shown in FIG. 1C, the method also includes creating a first metal gate electrode 125, by depositing a first metal in the first opening 120. In some preferred embodiments, creating a first metal gate electrode 125 further includes removing excess first metal 130 on the mold layer 115 and not in the first opening 120, to yield the structure shown in FIG. 1D.

Figure 1D:
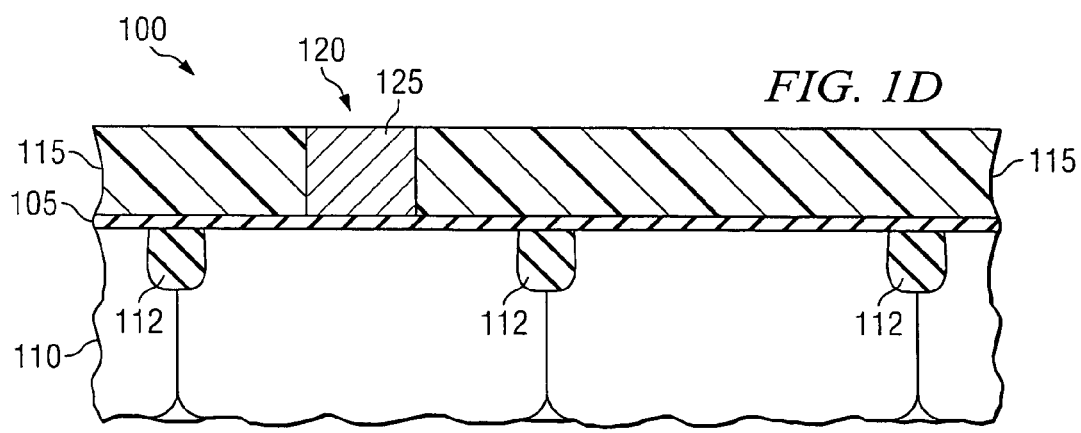
Figure 1E:
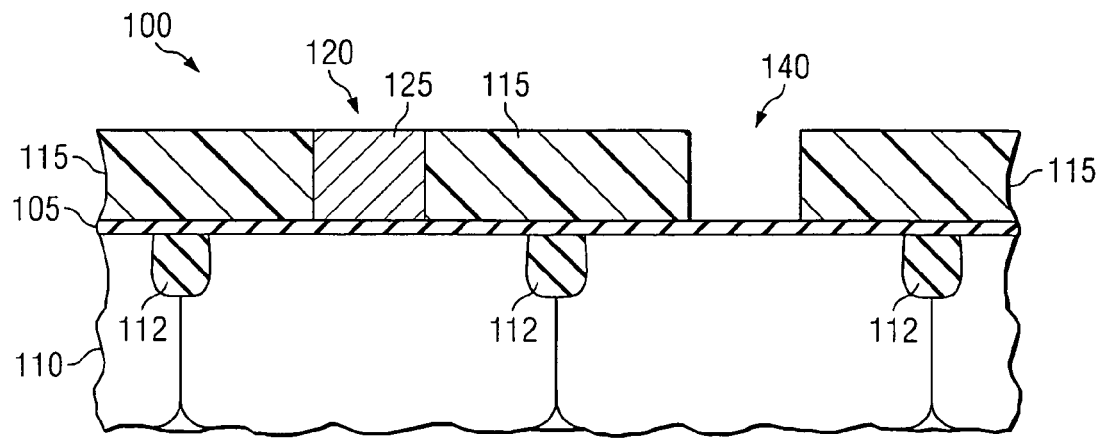
Figure 1F:
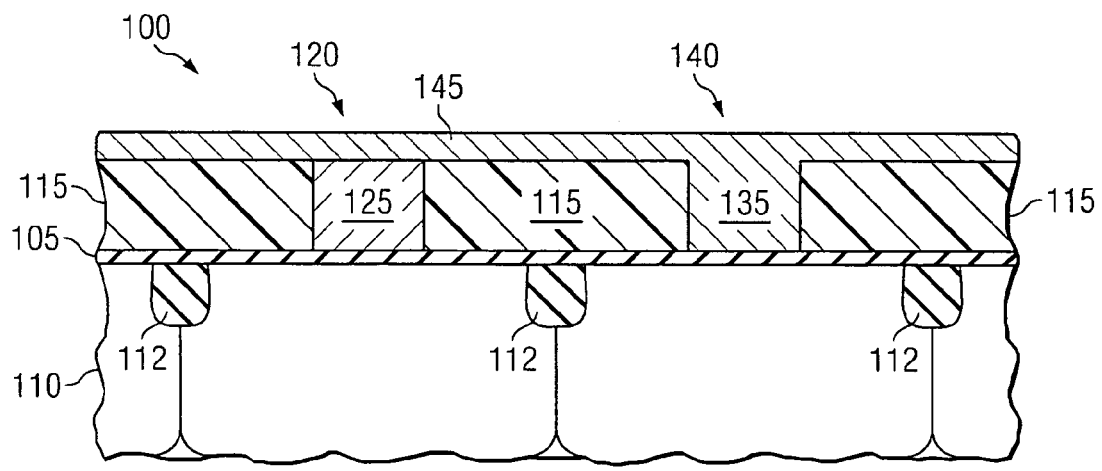
Figure 1G:
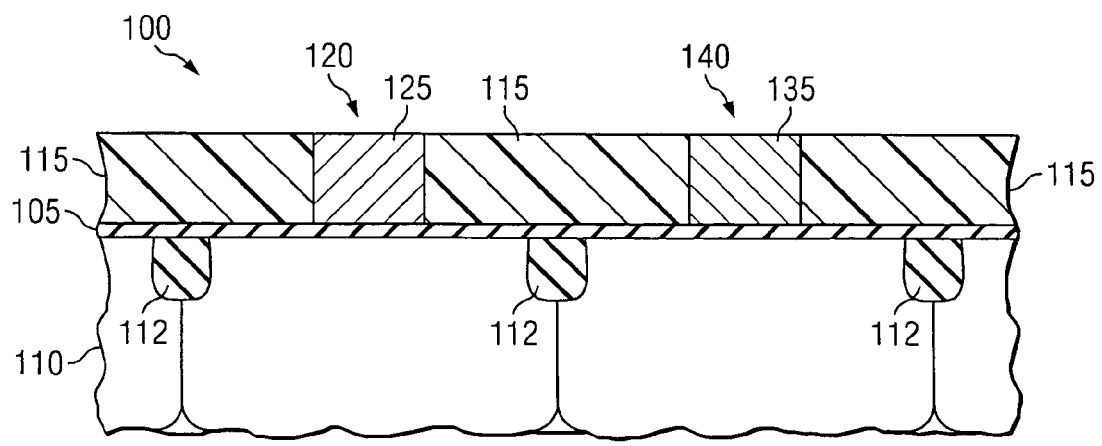

FIGS. 1E to 1G illustrate one preferred embodiment of the method that further includes creating a second metal gate electrode 135 over the substrate 110. In such embodiments, as shown in FIG. 1E, a second opening 140 is formed in the mold layer 115. The method continues, as shown in FIG. 1F, by depositing a second metal in the second opening 140 to form the second metal gate electrode 135. In some embodiments, creating a second metal gate further includes removing excess second metal 145 on the mold layer 115, and not in the second opening 140, to yield the structure shown in FIG. 1G.

Figure 1H:
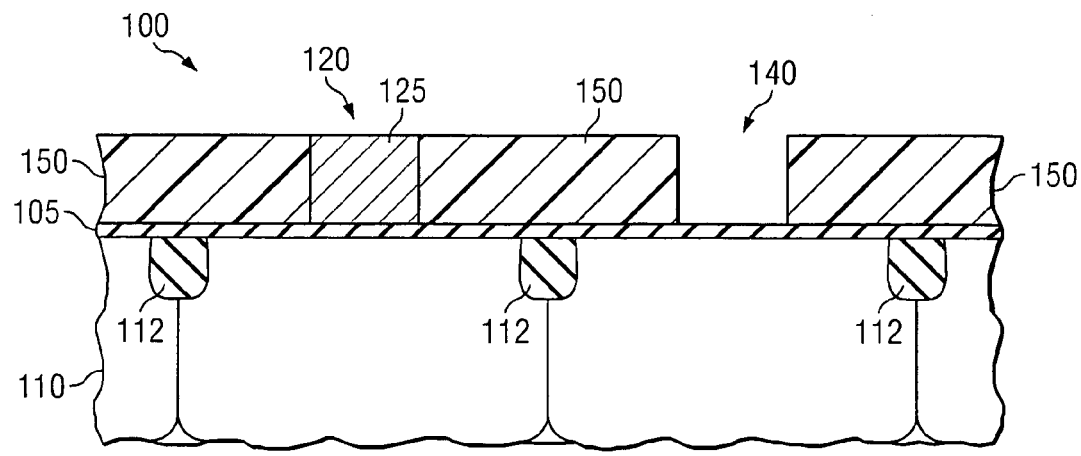
Figure 1I:
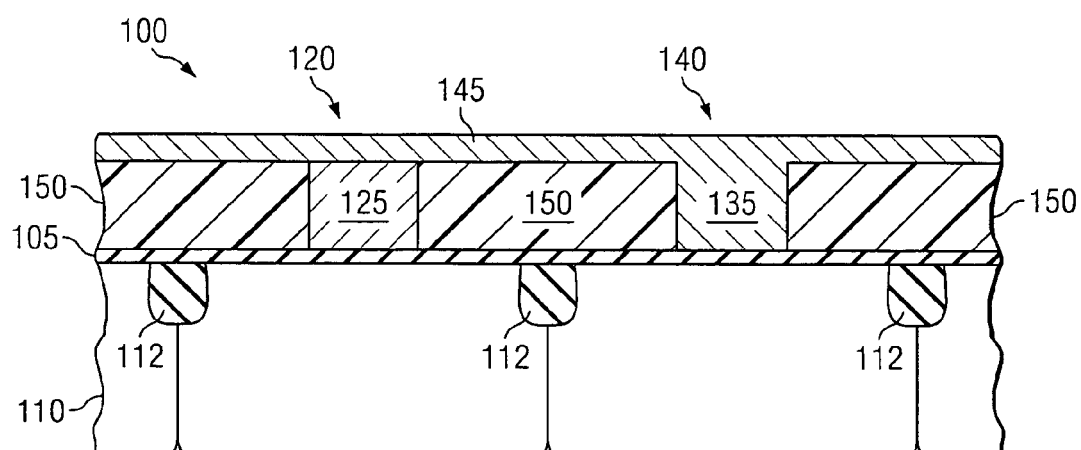
Figure 1J:
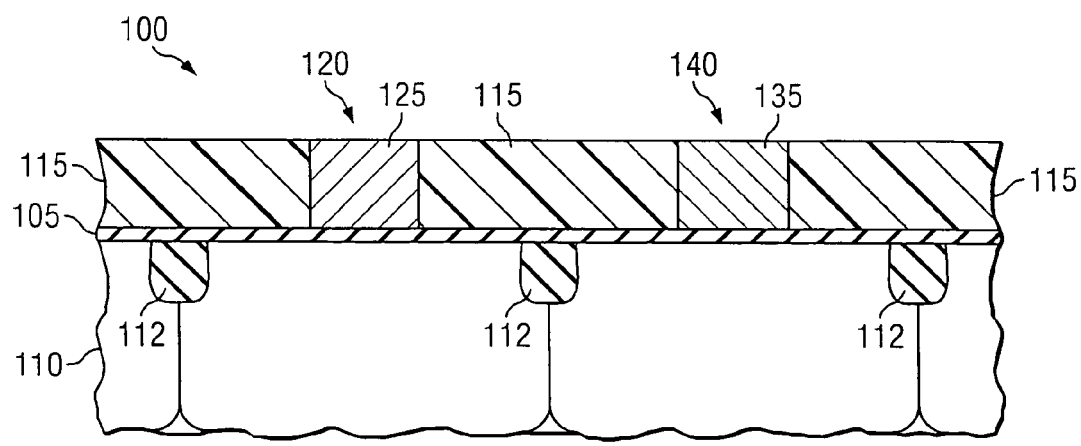

FIGS. 1H to 1J illustrate an alternative preferred embodiment of the method to create the second metal gate electrode 135 over the substrate 110. In these embodiments, the mold layer 115 illustrated in FIG. 1D is substantially removed and, as illustrated in FIG. 1H, a second mold layer 150 having the second opening 140 therein, is formed over the gate dielectric 105. As illustrated in FIG. 1I, the second metal gate electrode 135 is created by depositing a second metal in the second opening 140. Similar to that discussed above, in certain embodiments, excess second metal 145 on the second mold layer 150 and not in the second opening 140 is removed to yield the structure shown in FIG. 1J.

Figure 1K:
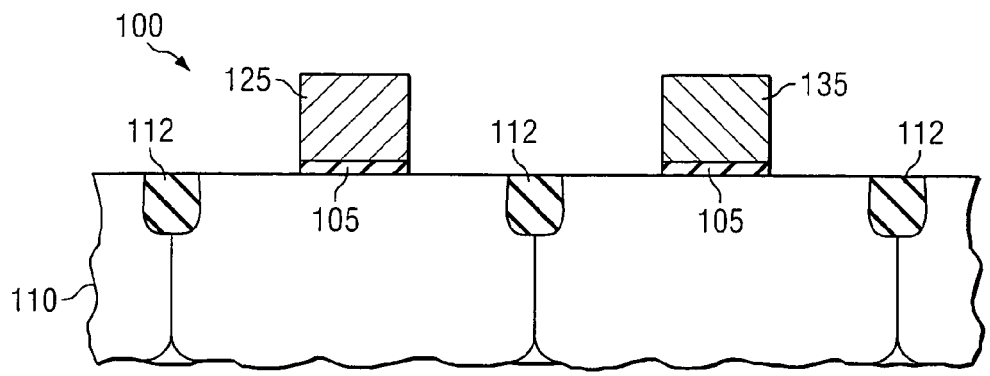
Figure 1L:
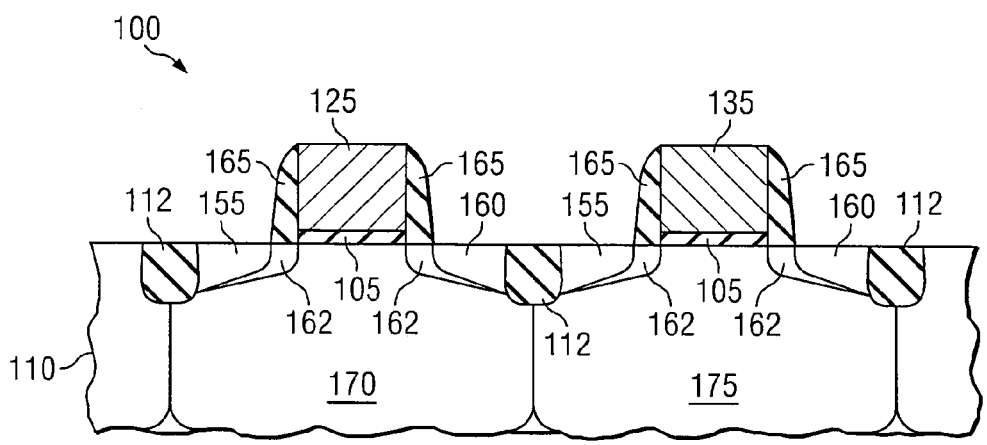

The exemplary method continues as shown in FIGS. 1K to 1L, with the fabrication of other semiconductor device components. As shown in FIG. 1K, certain embodiments include removing portions of the first mold layer 115 (FIG. 1G) or second mold layer 150 (FIG. 1J), as well as portions of the gate dielectric layer 105 not under the first and second metal gate electrodes 125, 135. As further discussed below, in other embodiments, however, portions of the first or second mold layer 115, 150 can be retained to serve as part of an interconnect structure.

As presented in FIG. 1L, certain embodiments of the method further include implanting dopants, with the metal gate electrodes 125, 135, serving as masks to facilitate forming source and drain structures 155, 160, and lightly doped drain regions 162, that are self-aligned with the first and second metal electrodes 125, 135. FIG. 1L also illustrates forming sidewalls 165 adjacent to the first and second metals electrodes 125, 135. Other embodiments of the method further include, as illustrated in FIG. 1L, the formation of NMOS and PMOS tubs, 170, 175.

With continuing reference to FIGS. 1A–1L, the substrate 110 and gate dielectric 105 can be any conventional materials suitable for use in semiconductor device manufacturing, such silicon and silicon dioxide or silicon oxynitride, respectively. In certain preferred embodiments, the gate dielectric 105 is a high dielectric constant material (e.g., a material having a higher dielectric constant than silicon dioxide), such as hafnium dioxide, hafnium silicate, hafnium silicon oxynitride or similar materials well known to those skilled in the art.

The materials serving as the mold layers 115, 150 are selected based on one or more desirable characteristics. In some embodiments, it is preferable for the mold layer material to be easily patterned, as further discussed below, and to have high temperature stability (e.g., melting or decomposition point above about 425° C.). In such embodiments, it is also desirable for the mold layers 115, 150 to have sufficient mechanical stability so as to remain intact when chemical mechanical polishing (CMP) or etching is performed to remove excess metal, 130, 145.

In certain embodiments, the mold layers 115, 150 are formed using conventional techniques, such as spin coating, to deposit a resist material over the substrate. The resist material may be any number of energy sensitive materials, well known to those skilled in the art, that can be patterned upon exposure to radiation, as further discussed below. Examples of suitable resist materials include polymethyl methacrylate, phenolic resin matrix and diazonaphthoquinone, poly cis-isoprene resin matrix and bisazide, phenol-formaldehyde copolymer and diazoquinone, polybutene-1-sulfone, glycidyl methacrylate and ethyl acrylate or similar compounds well known to those skilled in the art.

In other embodiments, the mold layers 115, 150 are composed of materials that can be easily removed with high selectivity over the gate insulating layer or the deposited metal and generally has a low dielectric constant (e.g., a low-k material having a dielectric constant less than silicon dioxide). Suitable materials include organic polymers, such as hydrogen silsesquioxane or methyl silsesquioxane. Such compounds are also favored because they have acceptable mechanical stability.

In still other embodiments, the mold layers 115, 150 are composed of an inorganic material having high mechanical stability such as silicon dioxide, silicon oxide aerogel, silicon oxyfluoride or silicon nitride. In some embodiments, the mold layer 115 and second mold layer 150 have different chemical compositions. In other preferred embodiments, however, the mold layer 115 and second mold layer 150 have substantially the same chemical composition. The mold layer 115 and second mold layer 150 can be formed over the substrate 110 using any number of conventional procedures, including chemical vapor deposition (CVD), physical vapor deposition (PVD), plasma enhanced CVD (PECVD), atomic layer deposition (ALD), spin coating, or other producers well known to those skilled in the art.

Any number of conventional techniques can be used to pattern and etch the mold layers 115, 150 to form openings 120, 140 suitable for depositing the metals to thereby form metal gate electrodes 125, 135. Such techniques include lithographic processes commonly used to fabricate devices such as integrated circuit devices, optical devices, microelectromechanical (MEMS) devices, etc . . . . In a typical lithographic process, a pattern is defined and developed in an energy sensitive material. The pattern is then used as an etch mask to transfer the pattern into a layer of material underlying the energy sensitive material serving as the mold layer 115, 150. In semiconductor device fabrication, the pattern is typically transferred into a mold layer 115, 150 formed over the substrate. Any number of radiation sources, including visible and ultraviolet light, x-rays, ion beam, or electron beam radiation, can be used in to facilitate pattern transfer.

As noted above, in some embodiments, after the first and second metal gate electrodes 125, 135 are created, it is desirable to substantially remove the entire mold layer 115, or in some embodiments, the second mold layer 150, before forming other components of the semiconductor device 100.

Any number of conventional damascene procedures may be used to deposit first or second metals in the openings 120, 140. The openings 120, 140 may be filled, for example, via physical and chemical vapor deposition. In particular, atomic layer deposition and electrochemical deposition are preferred because these techniques provide more uniform filling of the openings 120, 140.

In certain preferred embodiments the first and second metal gate electrodes 125, 135 have different work functions, corresponding to the work functions used in conventional NMOS and PMOS devices, respectively. In some embodiments, for example, the first metal is an $n^+$ metal having a work function between about 4 and about 4.2 eV, while the second metal is a $p^+$ metal having a work function between about 5 and about 5.2 eV.

Examples of suitable first metals having a work function between about 4 and about 4.2 eV include titanium, chromium, manganese, zirconium, tantalum; tantalum nitride, and mixtures thereof including alloys, nitrides and silicides. In certain preferred embodiments, the first metal is refractory metal, such as tantalum or tantalum nitride. Refractory metals are preferred because these metals remain chemically and structurally stable throughout subsequent transistor component fabrication steps, such as dopant implantation or thermal anneals.

Examples of suitable second metals having a work function between about 5 and about 5.2 eV include cobalt, nickel, molybdenum, ruthenium, rhodium, palladium, rhenium, iridium, platinum, gold, and mixtures thereof including alloys, nitrides and silicides. In certain preferred embodiments, the second metal is molybdenum or platinum, because these metals remain chemically and structurally stable throughout subsequent transistor component fabrication steps.

As noted above, in certain embodiments, the deposition of the first or second metal into the openings results in the deposition of excess metal 130, 145 on remaining portions of the mold layers 115 or second mold layer 150. In such embodiments, it is desirable to selectively remove portions of the excess metal that are above the mold layers 115, 150 but not inside the opening 120, 140. In some embodiments, for example, the excess metal 130, 145 is removed by chemical mechanical polishing (CMP). In other embodiments, the excess metal 130, 145 is removed by dry etching in fluorine or chlorine based chemistries.

Figure 2:
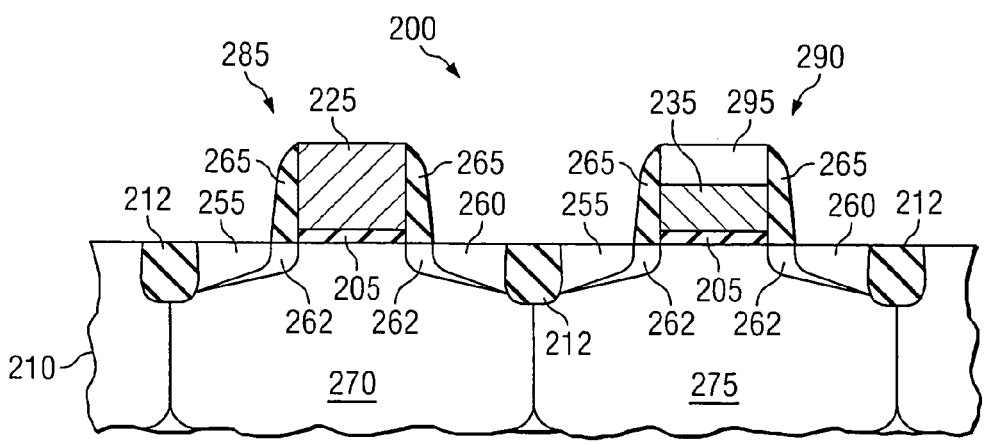
FIG. 2 illustrates a sectional view of an active device manufactured according to the principles of the present invention.

Yet another embodiment of the present invention, is an active device 200 produced by the processes described above and illustrated in FIGS. 1A to 1L. FIG. 2 illustrates a sectional view of an embodiment of an active device 200. Like reference numbers are used to depict structures analogous to that shown in FIGS. 1A to 1L. With continuing reference to FIGS. 1A to 1L, the active device 200 shown in FIG. 2 is produced by a process that includes forming a gate dielectric 205 over a substrate 210 and depositing a mold layer 115 having a first opening 120 therein over the gate dielectric 205. Also included in the process is the creation of a first metal gate electrode 225 by depositing a first metal in the first opening 120.

In some preferred embodiments the active device 200 is produced by processes that further include creating a second metal gate electrode 235 over the substrate 210 by forming a second opening 140 in the mold layer 115 and depositing a second metal in the second opening 140. In alternative embodiments, however, the active device 200 is produced by processes that further includes creating a second metal gate electrode 245 over the substrate 210 by removing the mold layer 115 and forming second mold layer 150 having the second opening therein 140 and depositing the second metal in the second opening 140.

Certain preferred embodiments of the active device 200 further include source drain and lightly doped regions 255, 260, 262, sidewalls 265 formed adjacent to the first and second metal gate electrodes 225, 235, as well as NMOS and PMOS tubs 270, 275 and isolation structures 212. In addition, as shown in FIG. 2 a doped polysilicon layer 295 may be deposited on one or both of the first and second metal electrodes 225, 235 to form a gate stack.

In some preferred embodiments of the active device 200, the first metal gate electrode 225 has a work function between about 4.0 and about 4.2 eV and the second metal gate electrode 235 has a work function between about 5.0 and about 5.2 eV. In yet other preferred embodiments, the active device 200 is a CMOS device that including an NMOS transistor 285 having the first metal gate electrode 225 and a PMOS transistor 290 having the second metal gate electrode 235.

Figure 3A:
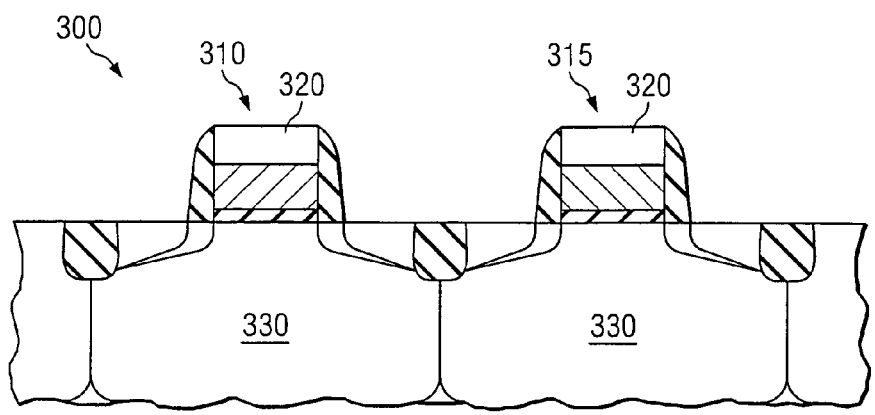
FIGS. 3A to 3B presents sectional views of a method for manufacturing an integrated circuit according to the principles of the present invention.
Figure 3B:
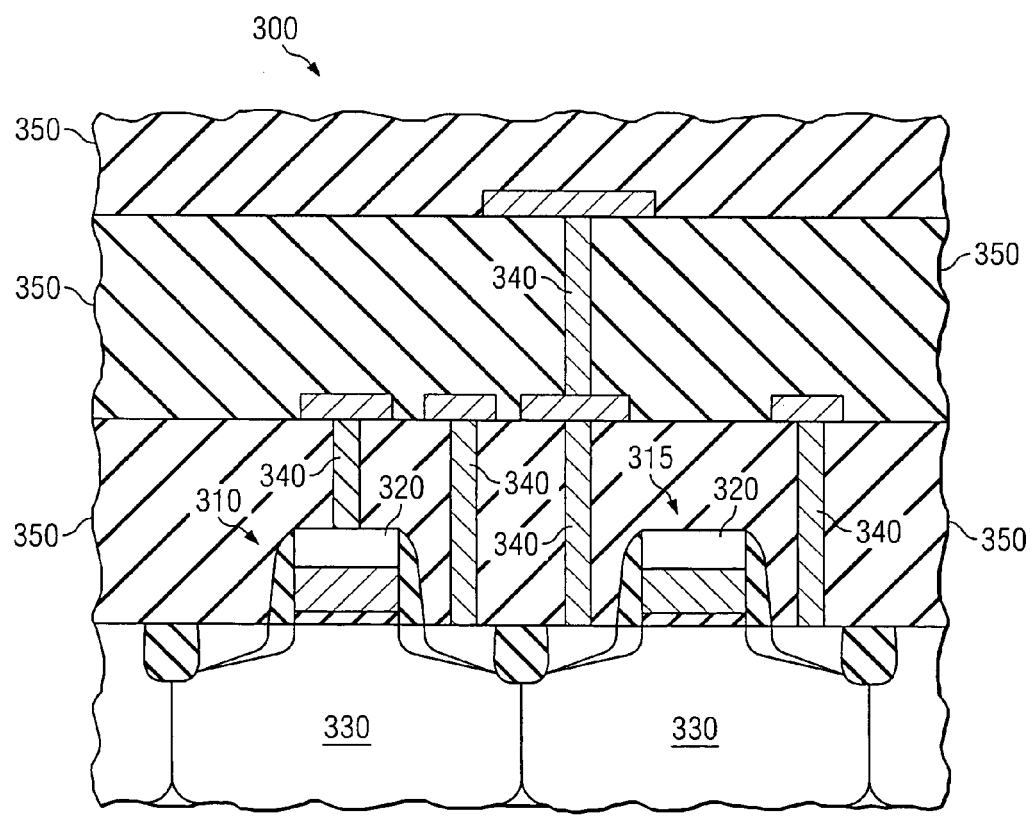

Yet another embodiment of the present invention is a method of manufacturing an integrated circuit. FIGS. 3A to 3B presents sectional views of a method for manufacturing an integrated circuit 300 according to the principles of the present invention. Turning to FIG. 3A, the method of manufacturing includes forming active devices 310, 315 having dual work function metal gate electrodes 320 over or in a semiconductor substrate 330. Any of the above-described processes can be used to form the active devices 310, 315. FIG. 3B shows forming interconnect metals lines 340 in or on one or more insulating layer 350 located over the active devices 310, 315. One of ordinary skill would understand that the method may further be extended to form any number of additional interconnects 340 and would also understand how to connect those interconnects 340 with the active devices 310, 315 to form an operative integrated circuit 300.

Although the present invention has been described in detail, one of ordinary skill in the art should understand that they can make various changes, substitutions and alterations herein without departing from the scope of the invention.

What is claimed is:

1. A method of forming dual work function metal gate electrodes in a semiconductor device, comprising:
   forming a gate dielectric over a substrate;
   depositing a first mold layer over said gate dielectric;
   etching said first mold layer to create a first opening;
   creating a first metal gate electrode by depositing a first metal in said first opening;
   removing said first mold layer;
   forming a second mold layer;
   then, etching said second mold layer to create a second opening; and
   depositing a second metal in said second opening.

2. The method as recited in claim 1, wherein first and second mold layers have different chemical compositions.

3. The method as recited in claim 1, wherein said mold layer is selected from the group consisting of
   a resist material;
   an organic polymer; and
   an inorganic material.

4. The method as recited in claim 1, wherein said first metal has a work function between about 4 and about 4.2 eV and said second metal has a work function between about 5 and about 5.2 eV.

5. The method as recited in claim 1, wherein said first metal is selected from the group consisting of:
   titanium;
   chromium;
   manganese;
   zirconium;
   tantalum;
   tantalum nitride; and
   mixtures thereof.

6. The method as recited in claim 1, wherein said first metal is selected from the group consisting of:
   cobalt;
   nickel;
   molybdenum;
   ruthenium;
   rhodium;
   palladium;
   rhenium;
   iridium;
   platinum;
   gold; and
   mixtures thereof.

* * * * *